(12) United States Patent
Arrowsmith et al.

(10) Patent No.: US 7,936,211 B2
(45) Date of Patent: May 3, 2011

(54) CONTROLLING THE PERFORMANCE OF A THERMIONIC TUBE

(75) Inventors: Colin Arrowsmith, Tyne & Wear (GB); Andrew Fallon, County Durham (GB)

(73) Assignee: KBO Dynamics International Limited, Consett, County Durham (GB)

( * ) Notice: Subject to any disclaimer, the term of this patent is extended or adjusted under 35 U.S.C. 154(b) by 84 days.

(21) Appl. No.: 12/462,629

(22) Filed: Aug. 6, 2009

(65) Prior Publication Data

US 2010/0033245 A1 Feb. 11, 2010

(30) Foreign Application Priority Data

Aug. 6, 2008 (GB) .................................. 0814382.8

(51) Int. Cl.
*H03F 3/68* (2006.01)
(52) U.S. Cl. ................................ 330/44; 30/109; 30/127
(58) Field of Classification Search .................... 330/44, 330/109, 127
See application file for complete search history.

(56) References Cited

U.S. PATENT DOCUMENTS

| | | | | |
|---|---|---|---|---|
| 4,199,730 | A | * | 4/1980 | Beck ............................... 330/109 |
| 5,422,599 | A | * | 6/1995 | Larsen ........................... 330/196 |
| 7,286,060 | B2 | | 10/2007 | Roberts et al. |

FOREIGN PATENT DOCUMENTS

| | | |
|---|---|---|
| DE | 2921831 | 12/1980 |
| GB | 1162046 | 8/1969 |
| GB | 2344237 | 5/2000 |
| GB | 2344237 A | 5/2000 |
| GB | 2410142 | 7/2005 |
| GB | 2410142 A | 7/2005 |
| JP | 9307386 | 11/1997 |
| JP | 11-27055 A | 1/1999 |
| JP | 11-27056 A | 1/1999 |

* cited by examiner

*Primary Examiner* — Michael B Shingleton
(74) *Attorney, Agent, or Firm* — James Creighton Wray

(57) ABSTRACT

Controlling the performance of the thermionic tube (102) having a cathode (103), a plate (104) and a grid (105) is disclosed. The tube is configured to provide amplification of an audio derived signal (106) and is arranged to apply a grid bias voltage to the grid. The absence of an input audio signal is detected whereafter output current between cathode and plate is measured to identify actual output current. The actual output current is compared against a preferred output current and the grid bias voltage is adjusted so as to bring the actual output current value towards the preferred output current value.

20 Claims, 12 Drawing Sheets

CONTROLLING THE PERFORMANCE OF A THERMIONIC TUBE

CROSS REFERENCE TO RELATED APPLICATIONS

This application claims priority from United Kingdom Patent Application No. 0814382.8, filed Aug. 6, 2008, the whole contents of which are incorporated herein by reference in their entirety.

BACKGROUND OF THE INVENTION

1. Field of the Invention

The present invention relates to a method of controlling the performance of a thermionic tube having a cathode, a plate and a grid. The present invention also relates to an apparatus for controlling the performance of a thermionic tube when amplifying an audio signal and to an audio signal amplifier.

2. Description of the Related Art

Despite advances in solid state technology for the amplification of audio signals, specialist markets continue to exist for the deployment of thermionic devices, in which amplification is achieved by controlling the flow of electrons in an evacuated tube. Such devices are usually referred to as thermionic tubes or thermionic valves which will be referred to herein as thermionic tubes.

Thermionic tubes continue to be used in high quality audio amplifiers in which to obtain optimum performance, a triode thermionic tube may be arranged to operate in a class A configuration, in which a bias signal is applied such that a single valve may be responsive to both the positive and negative half cycles of an incoming audio signal. An optimum level of bias may be selected during the manufacture of the amplifier and again this bias signal may be adjusted periodically. However, it is known that thermionic tubes degrade through operation therefore after a period of use, although being perfectly functional, degradation may have occurred such that a previous optimum bias level may have become less than optimum for the current operational characteristics of the tube. Thus, in order to maintain optimum performance, it would be preferable for the bias level to be adjusted on a regular basis throughout the lifetime of the tube. However, currently, such an approach would be unrealistic except for very high quality professional applications.

It is also known for thermionic tubes to be used in amplification systems for musical instruments and in particular for electric guitars, including electric base guitars. Some amplifiers of this type operate in class A mode but the majority operate in class B, in which one tube handles the positive half cycle and a co-operating tube deals with the negative half cycle of the input audio signal. To improve linearity it is also known to operate in class A/B mode, thereby obtaining a compromise between the linearity of class A and the power saving characteristics of class B.

It has become standard practice in guitar amplifiers for the tubes to be overdriven well beyond there recommended operating conditions, in which the resulting distortion is embraced as enhancing the overall musical effect; the amplification system effectively becoming part of the instrument. A consequence of driving thermionic tubes to their limits in guitar amplifiers is that the tubes themselves rapidly become degraded and when not actually being played it would be desirable for measures to be taken to ensure that the tubes are not unnecessary forced to work when an output signal is not required. However, presently, except for placing a guitar amplifier in a standby condition, which usually removes the high tension (HT) supply to the tubes, no systems exist for monitoring the performance of the tubes and adapting a working environment, so as to enhance their performance characteristics while at the same time limiting unnecessary damage.

BRIEF SUMMARY OF THE INVENTION

According to an aspect of the present invention, there is provided a method of controlling the performance of a thermionic tube having a cathode, a plate (or anode) and a grid that is configured to provide amplification of an audio derived signal, including the application of a grid bias voltage to the grid. The method comprises the steps of detecting the absence of an input audio signal and, in the absence of an input audio signal, measuring output current between a cathode and a plate of the tube to identify an actual output current value, comparing said actual output current value against a preferred output current value and adjusting a grid bias voltage so as to bring said actual output current value towards said preferred output current value.

Thus, in this way, the performance of the tube may be monitored continually during periods when no audio signal is present so as to obtain an optimum level of current flow by adjusting the bias voltage.

DETAILED DESCRIPTION OF THE PREFERRED EMBODIMENTS

FIG. 1

Figure 1:
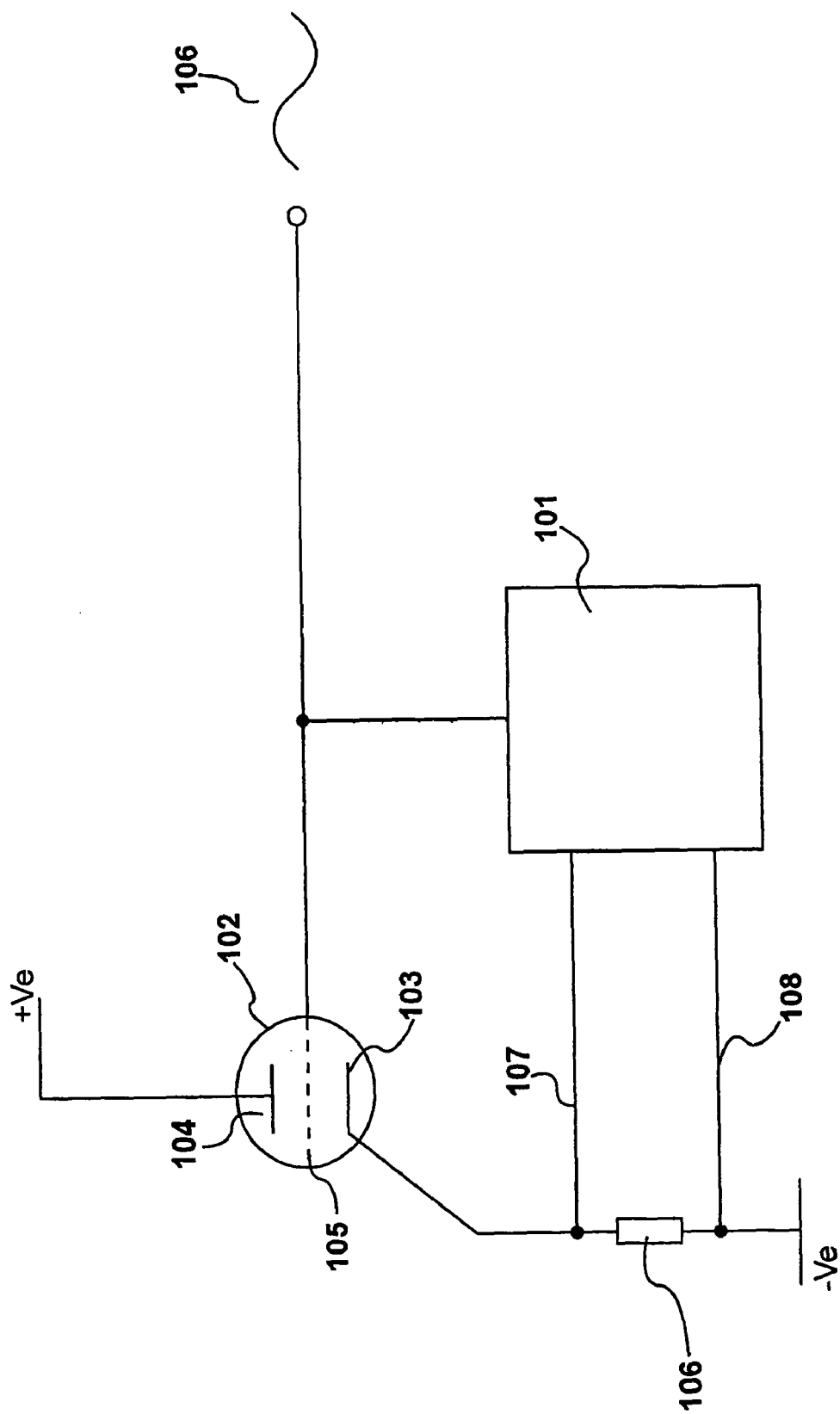
FIG. 1 shows a device for controlling the performance of the thermionic tube.

A device 101 for controlling the performance of a thermionic tube or valve 102 when amplifying an audio signal is shown in FIG. 1. The thermionic tube 102 has a cathode 103 a plate (or anode) 104 and a grid 105 for receiving a grid bias voltage 101 and an audio input signal 106.

The tube is also provided with a heating device, as is well known in the art, that heats the cathode 103 to make electrons available that are attracted to the high positive voltage applied to the plate.

The grid 105 placed in the electron flow close to the cathode forces some electrons back to the cathode when the bias voltage is applied. Thus it is possible to control current flow for a given voltage by making the grid more or less negative.

With the grid made very negative the tube is completely turned off and with no bias applied to the grid, the tube becomes fully turned on.

The application of audio signal 106 to a control grid modulates the flow of electrons but if a signal goes positive, it is not possible to make more electrons flow. Thus it is necessary to apply a bias which makes the grid negative by say 10 volts. Thus, the tube is deliberately throttled back so that it is now possible to apply an alternating signal ranging between minus 5 volts and plus 5 volts.

As is known in the art, a resistor is placed in series with the anode such that the current flow will produce a varying voltage at the anode much bigger than that applied to the control grid. Thus, an input signal varying between minus 5 volts and plus 5 volts may amplify to minus 100 volts and plus 100 volts which in turn represents the gain of the valve.

Triode valves of the type illustrated in FIG. 1 are considered to give the least amount of audio distortion but compared to other configurations there gain is relatively low. Thus, as is known in the art, in some applications tetrode valves or pentode valves may be deployed in order to mitigate the effect of Miller capacitance.

In order to power a loudspeaker, an additional power tube used for high-power but having a relatively lower voltage gain. A stereo amplifier may typically include four tubes, with two tubes being deployed for each stereo channel.

Tubes have a high impedance so it is necessary to provide a transformer within the amplifier, in the anode circuit, allowing a loudspeaker to be matched to the amplification circuit.

It is also known, particularly in guitar amplifiers, to use tubes in a push-pull configuration also referred to as class B operation. One transformer is used with a centre tap and an earlier stage splits an incoming audio signal into two half cycles by means of a phase splitter. Thus, each tube amplifies half of the signal with typically two tubes being provided for the amplification of each phase. Thus, a guitar amplifier may typically include four tubes (with more if a higher power output is required) but arranged in a different configuration to that of a typical stereo amplifier.

Class B operation allows the tubes to cool down and in practice this configuration may operate at higher power levels. The two portions of the output signal are then combined by means of an impedance matching transformer. However, a problem may exist with this configuration in that if the tubes become unmatched, a degree of distortion will be introduced.

It is known that tubes start to degrade after a relatively short period of time, particularly when compared to solid state devices. Manufacturers produce tubes in matched pairs and even in quartets or octets for high-power amplifiers but this process increases the overall cost of the tubes significantly. Furthermore, after typically 100 hours of use they will tend to degrade by differing amounts and will therefore no longer be matched. Consequently, in order to maintain optimum performance it is known for the tubes to be replaced at regular intervals. It is also known for tubes to be rebiased but again this requires manual intervention on the part of a skilled technician.

Although it is known to control bias, it is typical for the same bias signal to be supplied to all of the tubes, thus the bias level may be adjusted but only once. Consequently, such an approach does not provide any compensation for tubes degrading by differing extents.

As the tube ages, it is known to reduce bias because as the tube gets older, electron emission from the cathode 103 diminishes. However, if the bias is reduced too much, this may result in too much current flowing through the tube which, although not immediately apparent to the user, will result in the tube operating outside its optimum range and will result in further degradation.

The control device 101 of a preferred embodiment seeks to identify a preferred current flow and then maintain this for the operational life of each tube. Thus, any tube 102 controlled by the control device 101 would be biased to obtain these optimised conditions and with a plurality of tubes provided within an amplifier, each tube is individually biased.

In the embodiment of FIG. 1, a low value resistor 106 of typically one ohm is introduced into the cathode circuit and a voltage is tapped off which is dependent upon the current passing through the tube. This voltage is supplied to the control device 101 so that the control device is in a position to determine the level of the actual current flowing through each tube 102. A grid bias voltage is then generated to provide a voltage to each individual grid which is in turn the voltage required to maintain the current at a constant optimum level. Thus, the control device 101 is configured to ensure that whenever possible, the tube 102 is operating at a preferred level of current when no audio signal 107 is present.

With tubes operating in the class B push-pull mode, it is possible to improve the balance between co-operating tubes so as to minimise the presence of standing DC current in the output transformer. This minimises heat dissipation within the transformer and also reduces audio distortion.

Figure 2:
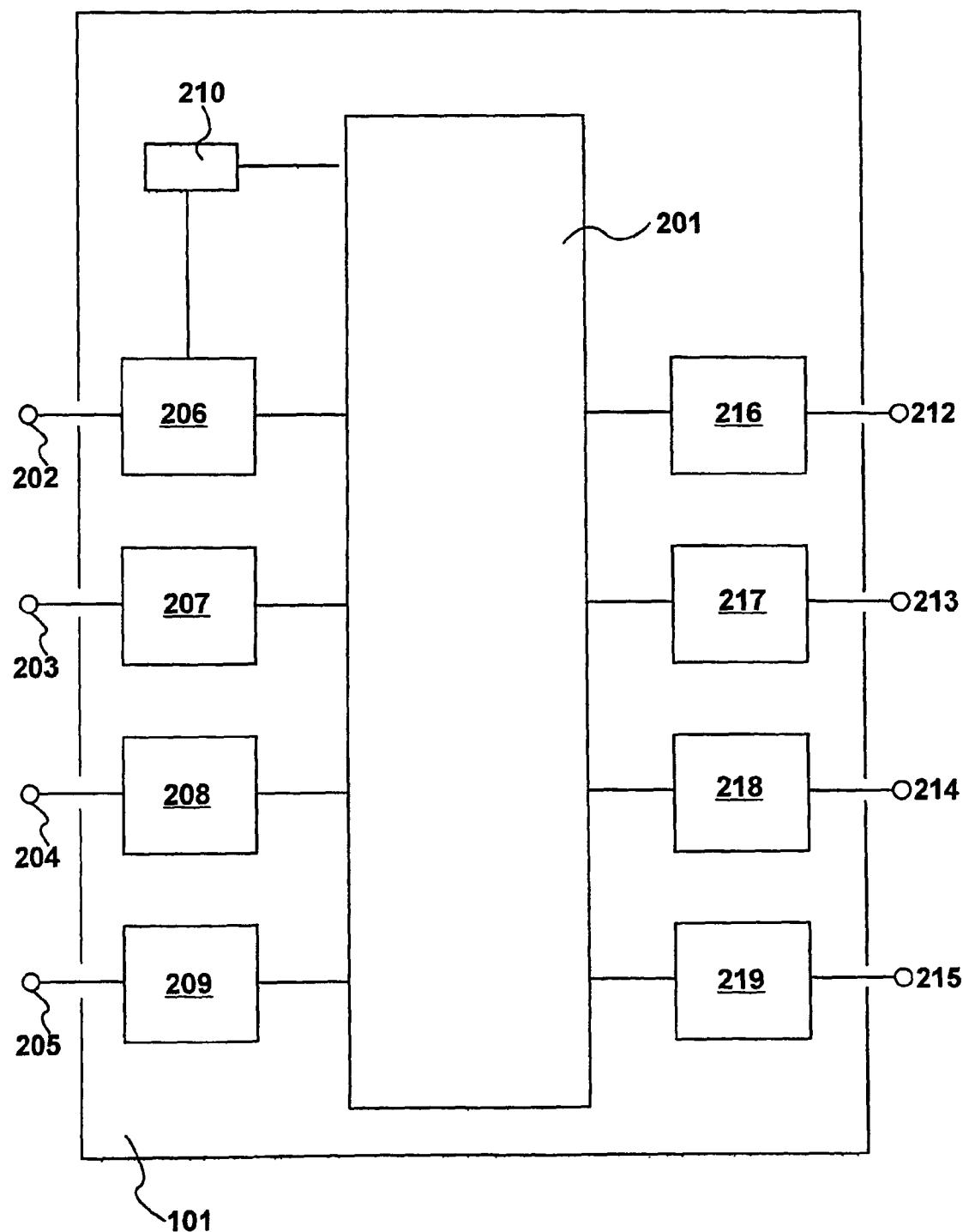
FIG. 2 details the control device identified in FIG. 1.

Lines 107 and 108 for measuring cathode current (by measuring the voltage drop across resistor 106) supply DC levels to the control device 101 and they also supply an alternating signal when an audio signal 106 is present. It is possible for such a signal to be detected which in turn provides an indication to the control device 101 that an audio signal is present. This is desirable because the control device is configured to make adjustments when no audio signal is present and for the adjustment routines to be inhibited when an audio signal is detected. However processing and balancing operations performed by the control device only require relatively short periods of no audio signal being present therefore it is possible for the controlling operations to be effected even between audio tracks in the hi-fi amplifier implementation.
FIG. 2

Control device 101 is detailed in FIG. 2. The control device 101 includes a programmable microprocessor/micro controller for processing digital signals in response to program control. In a preferred embodiment, the processing device 201 may be implemented as a PIC (peripheral interface controller) processor, being provided with a plurality of input ports, a plurality of output ports and internal non-volatile storage. Thus, data may be stored within the processing device by the provision of electrically erasable programmable read only memory (E2PROM).

Figure 11:
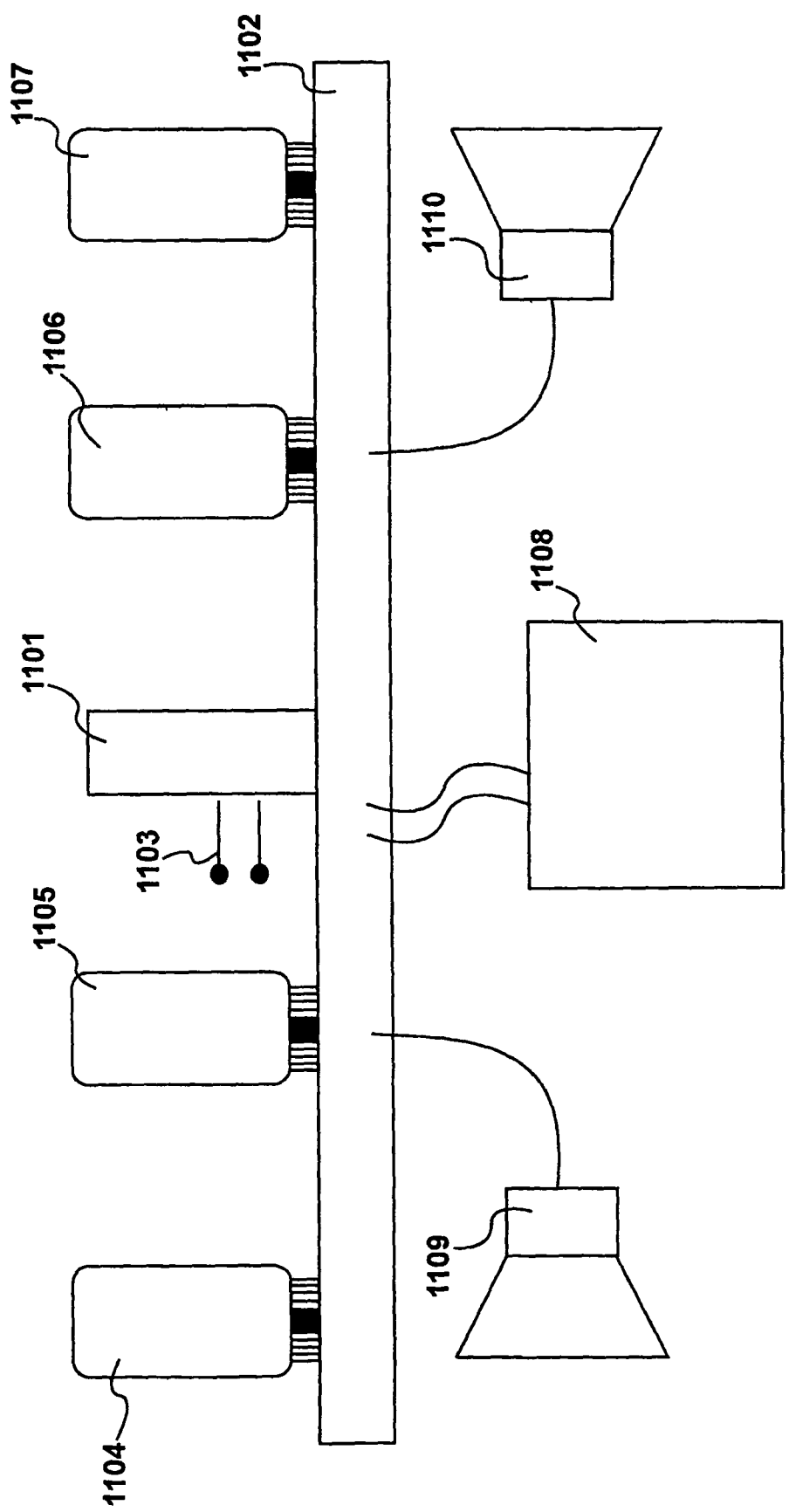
FIG. 11 shows a control device in the form of a module attached to a circuit board.
Figure 12:
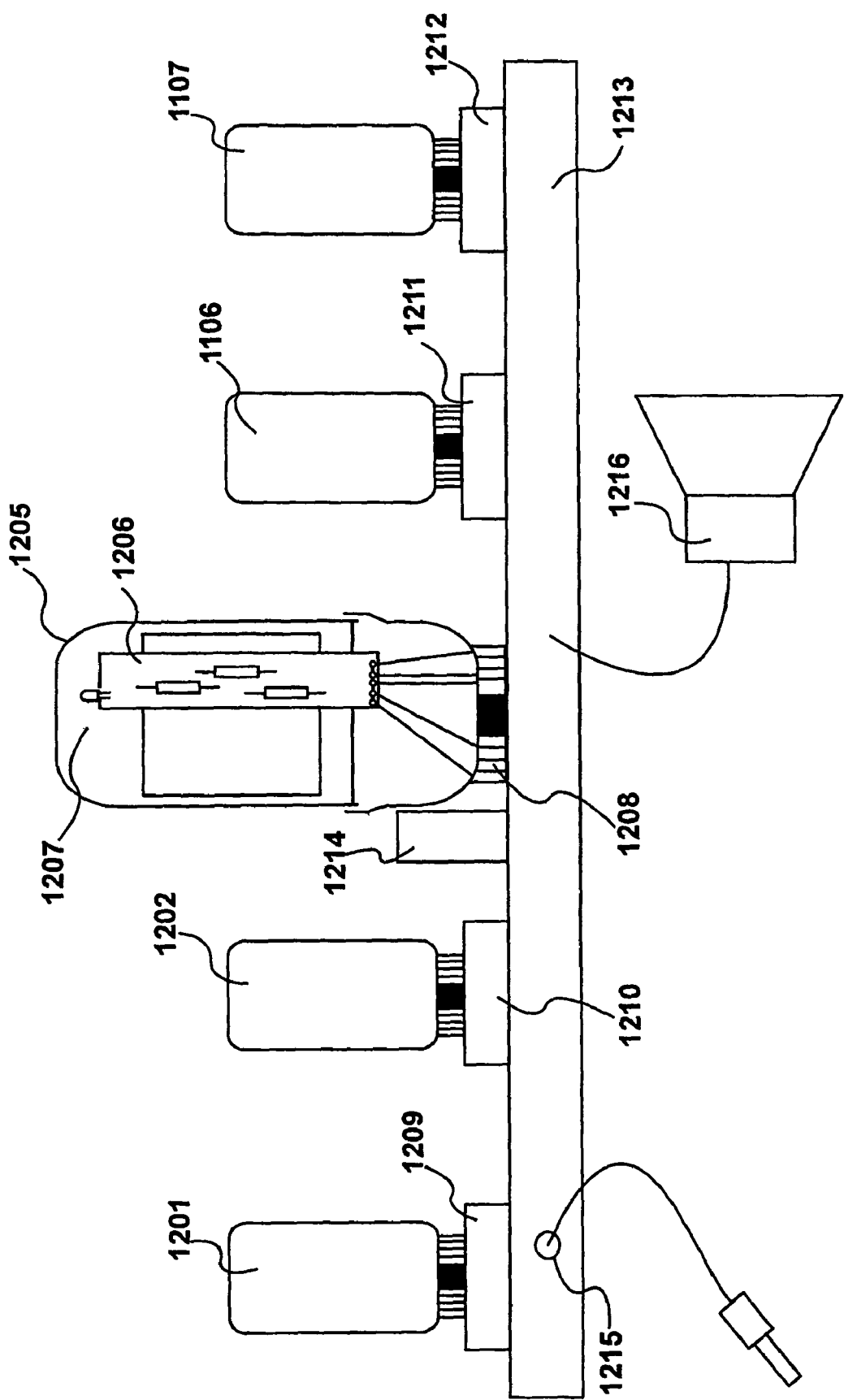
FIG. 12 shows the control device housed in an acrylic tube for application in guitar amplifiers.

In preferred embodiments, the control EEPROM device 101 is implemented as a module which may be included in an amplifier design (detailed in FIG. 11) or retrofitted to existing amplifier systems, as detailed in FIG. 12. A preferred module is capable of controlling four thermionic tube devices, although the procedures performed for each of these tubes are entirely independent and therefore the number of tubes controlled may vary significantly. However, many amplifier designs do include four tubes and for amplifiers containing more than four tubes an appropriate number of control devices may be provided. Again, each of these devices acts independently and there is no requirement to provide a master/slave configuration for example, in the preferred embodiment.

Input voltages, representing cathode currents, for each of the four tubes present within the amplifier design are supplied to respective inputs 202, 203, 204 and 205. Each input is supplied to an input of the processing device 201 via a respective amplifying and buffering circuit 206, 207, 208 and 209. Thus, in a preferred embodiment, analog signals are supplied to the processing device 201 and analog to digital conversion is performed under program control.

Input circuit 206 also supplies its respective input signal to an audio frequency detection circuit 210. Thus, when the circuit 210 detects the presence of an audio signal a disabling signal is supplied to the processing device 201 which disables performance control, possibly by the implementation of an interrupt routine. Input circuit 207 is detailed in FIG. 3.

Output lines 212, 213, 214 and 215 provide control voltages to each respective tube being controlled. Output ports from the processing device 201 supply digital control signals to output circuits 216, 217, 218 and 219 and digital to analog conversion devices are provided within the output circuits in order to maintain stability and reduce noise. Output circuit 217 is detailed in FIG. 4.

FIG. 3

Figure 3:
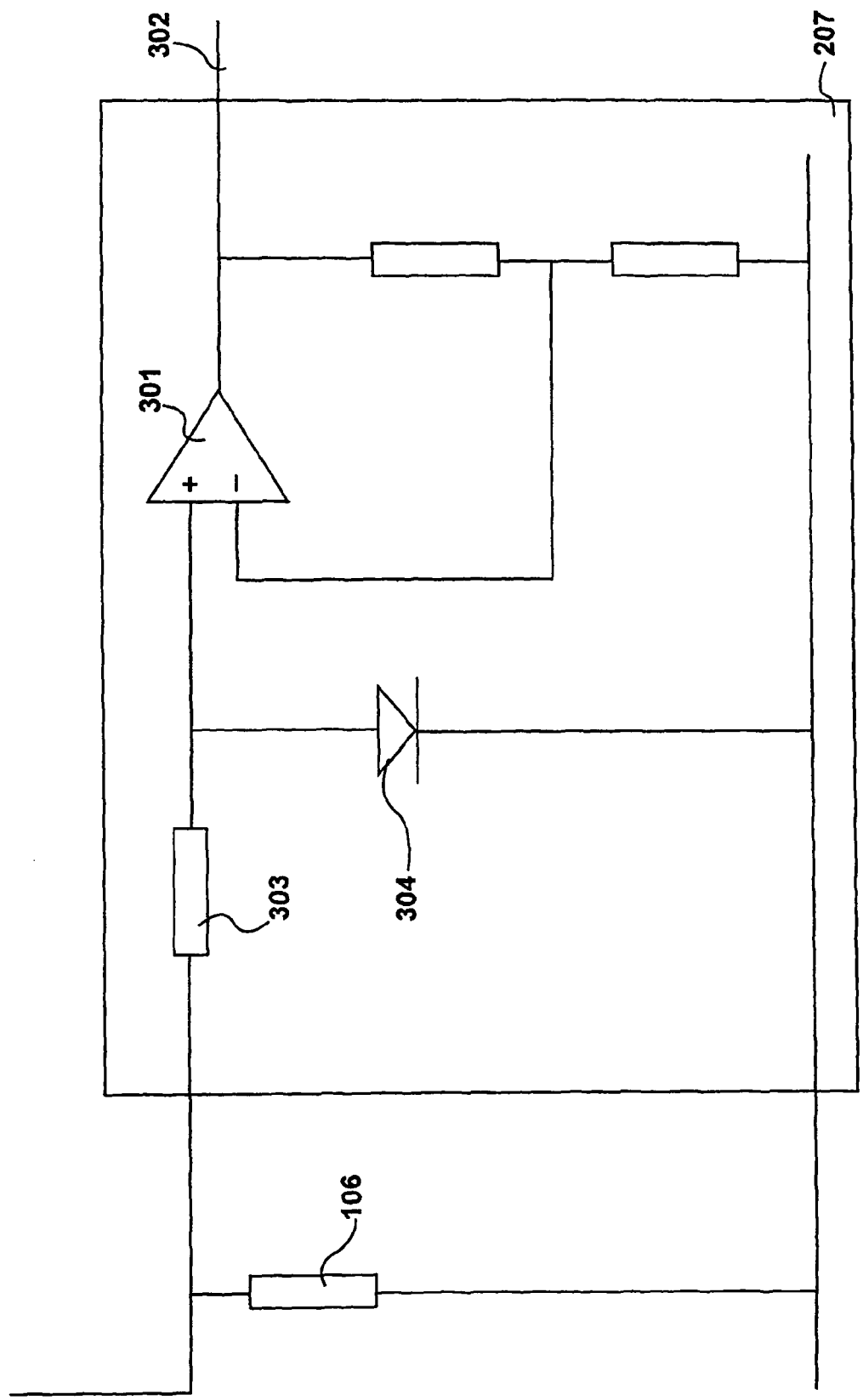
FIG. 3 details the input circuit identified in FIG. 2.

Input circuit 207 is shown in FIG. 3, connected to a cathode current measuring resistor 106. In a preferred embodiment, one volt appears across resistor 106 for each amp that is conducted. Preferably, the control device 101 is configured to measure cathode currents up to 250 mA.

A non-inverting amplifier 301 produces a gain of 20 in the preferred embodiment thus a maximum cathode current will produce an output voltage on output line 302 of 5V. This is supplied to a ten bit analog to digital converter that forms part of the processing device 201. Thus, for the available voltage range of 0 to 5V, internal numbers are produced over a one thousand and twenty-four level range.

Current flow to the non-inverting amplifier 301 is controlled via an input resistor 303 and a protection diode 304 protects the processing device 202 should a very high cathode current be present. The non-inverting amplifier 301 (an operational amplifier) has a high input impedance so it does not play any part in terms of the loading of the signal.

Input circuit 206 also provides an AC coupled input to detection device 210. A capacitor within circuit 210 isolates the AC signal from the DC level and feeds this to an analog to digital converter within the processing device 201. If there is no AC signal present, 2.5 volts will appear across a potential divider and a steady DC level will be present on the input. However, if any alternating current is present, a variation in the signal is produced. Processing device 201 stores the input value produced by detector 210 and compares this upon each execution loop. If consecutive measured levels are different, the processing device 201 assumes that an audio signal is present and bias control is inhibited.

FIG. 4

Figure 4:
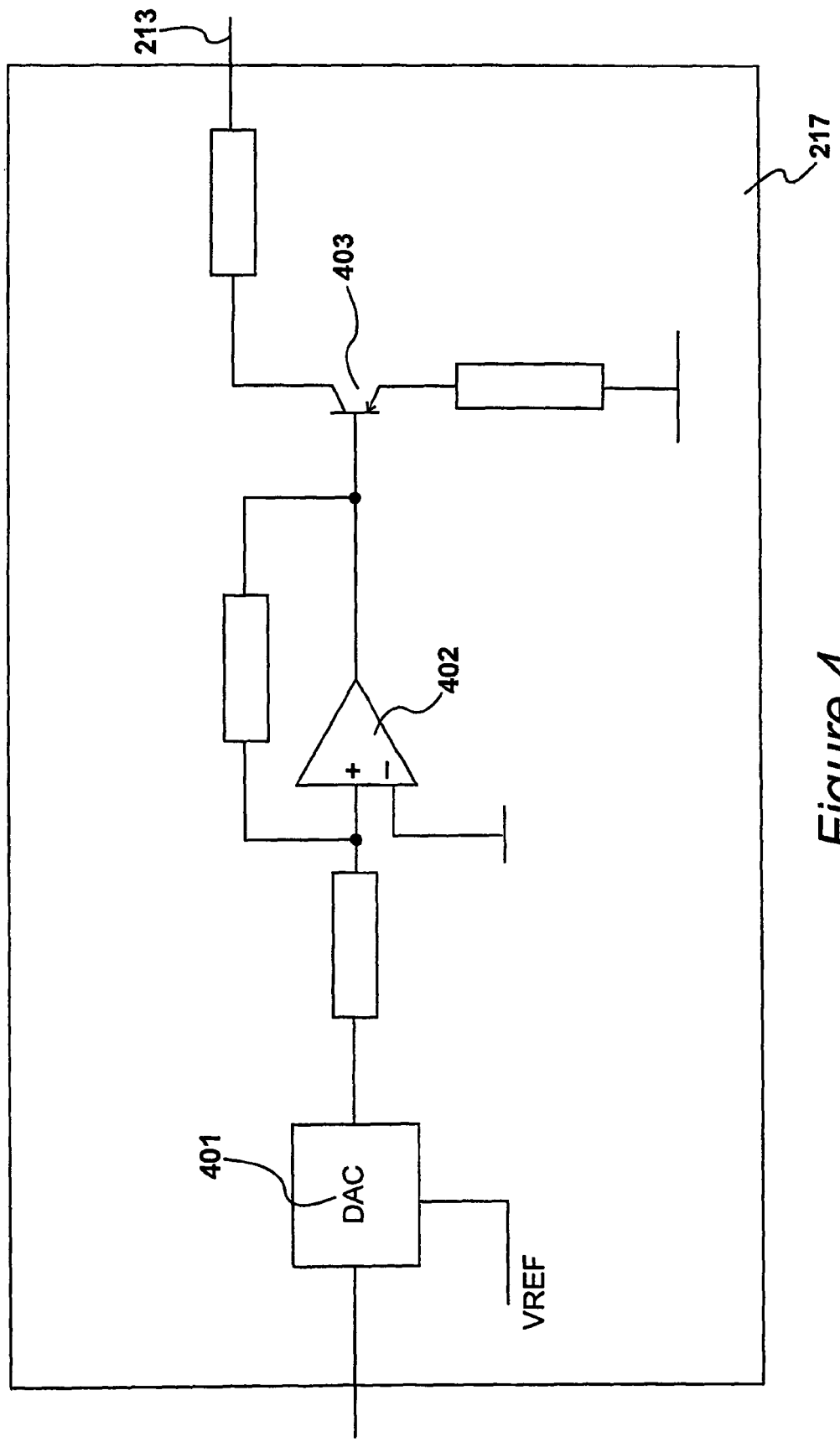
FIG. 4 details the output circuit identified in FIG. 2.

Output circuit 217 is detailed in FIG. 4. A digital output from the processing device 201 is supplied to a digital to analog converter 401 which in turn producers an analog voltage that is supplied to a non-inverting buffering amplifier 402. An output from buffering amplifier 402 is supplied to output line 213 via a (PNP) bipolar transistor 403.

FIG. 5

Figure 5:
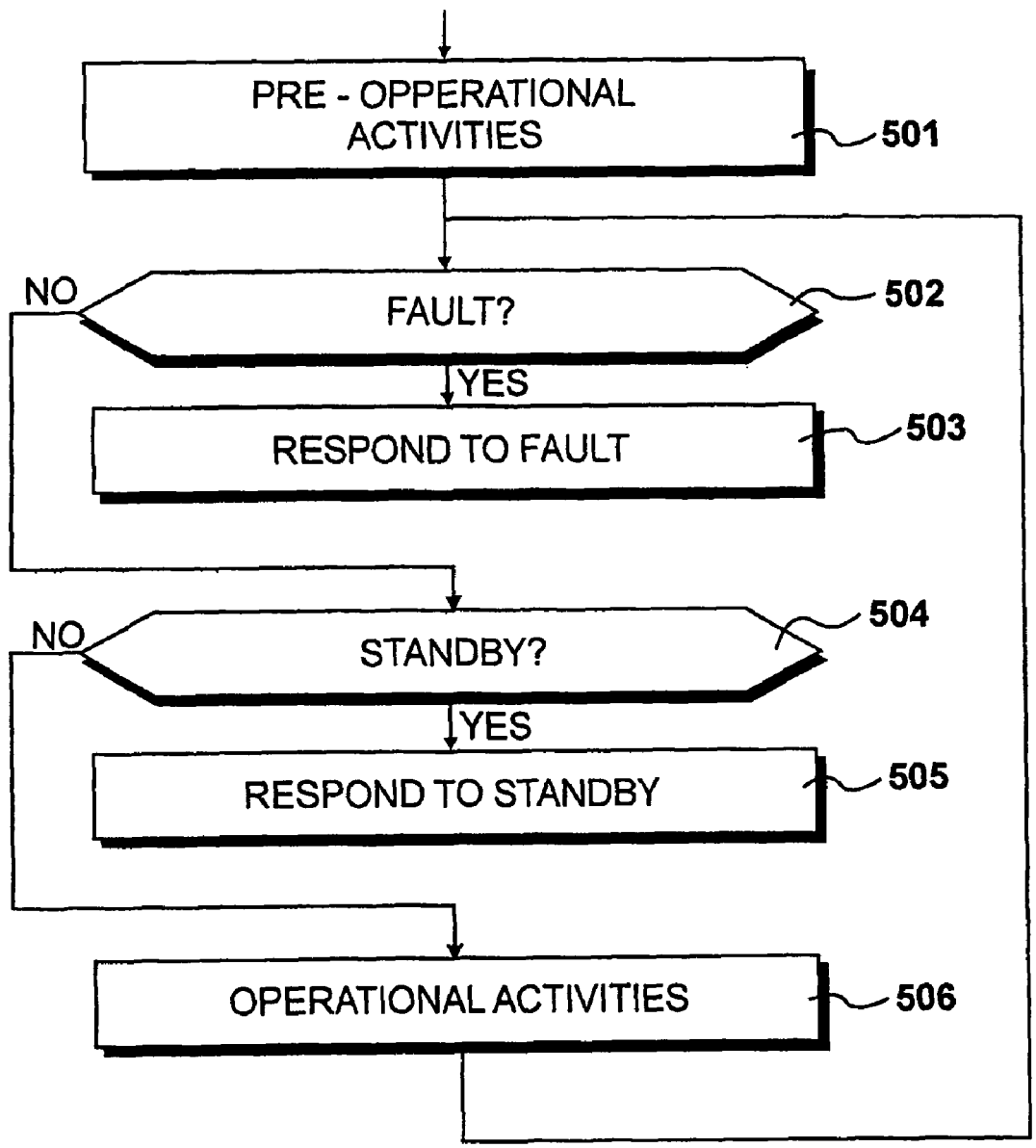
FIG. 5 shows procedures implemented within the processing device identified in FIG. 2.

Procedures implemented within the processing device 201 are shown in FIG. 5. Under these procedures, the processing device 201 implements a method of controlling the performance of a thermionic tube having a cathode 103, a plate 104 and a grid 105 that is configured to provide amplification of an audio derived signal and includes the application of a grid bias voltage to the grid 105.

Circuit 210 is provided to detect the absence of an input audio signal and in the absence of this audio signal, output current is measured between cathode 103 and plate 104 to identify an actual output current value, preferably determined by measuring the voltage drop across series resistor 106. The control device 101 compares the actual output current value against a preferred output value and adjusts the grid bias voltage so as to bring the actual output current value towards the preferred output current value.

In step 501 the processing device 201 performs pre-operational activities that include initiating the processing device to set up operating conditions that includes initiating registers, inputs and outputs. It also resets all flags and enables interrupts. These pre-operational activities are detailed in FIG. 6.

In step 502 a question is asked as to whether a fault condition has been identified. A fault condition exists when the cathode current flow is extremely high (beyond normal operation) and such a condition will have been identified when the amplifier was previously used. Thus, the control device 101 stores the fault condition in non-volatile memory such that on returning power to the amplifier after a period of non-use, the fault condition will remain and further damage to the amplifier is avoided. The detection of theses fault conditions is detailed in FIG. 8.

Having detected a fault condition at step 502, a response is made to the fault. In a first embodiment, this response may effectively involve shutting down the amplifier and raising an alert to the effect that technical intervention is required. However, in a more sophisticated embodiment, it is possible for the amplification tubes to be provided in banks such that a plurality of tubes are operating in parallel for each side of the positive or negative halve cycle. Thus, under theses situations, a single faulty tube could be identified and disconnected from its HT supply, possibly using field effect transistors. Furthermore, when operating in the class B push-pull configuration, if one tube is disabled in this way, its partner on the co-operating halve cycle is also disabled so as to maintain balance within the amplifier itself. In a further enhanced embodiment, it would also be possible to apply additional drive to the remaining tubes thereby compensating for the overall loss of power. Furthermore, a user would be alerted to the modified form of operation allowing the user (possibly a stage guitarist) to make repairs at a later date while being able to maintain a performance.

If the question asked at step 502 is answered in the negative, to the effect that a fault does not exist, a question is asked at step 504 as to whether the amplifier has been placed in a standby condition. Some amplifiers, such as guitar amplifiers, provide a switch allowing a user to select a standby condition which in turn removes the HT supply from the tubes. Thus, in a preferred embodiment, the standby condition is identified by the cathode current being very low, as detailed in FIG. 8. Thus, on detecting a standby condition by a standby flag being set, the control device 101 is placed in a similar condition so as to avoid inappropriate bias control. If the question asked at step 504 is answered with a negative to the effect that the amplifier is not in a standby condition (and having previously identified the amplifier as not being in a fault condition), operational activities are initiated at steps 506.

FIG. 6

Figure 6:
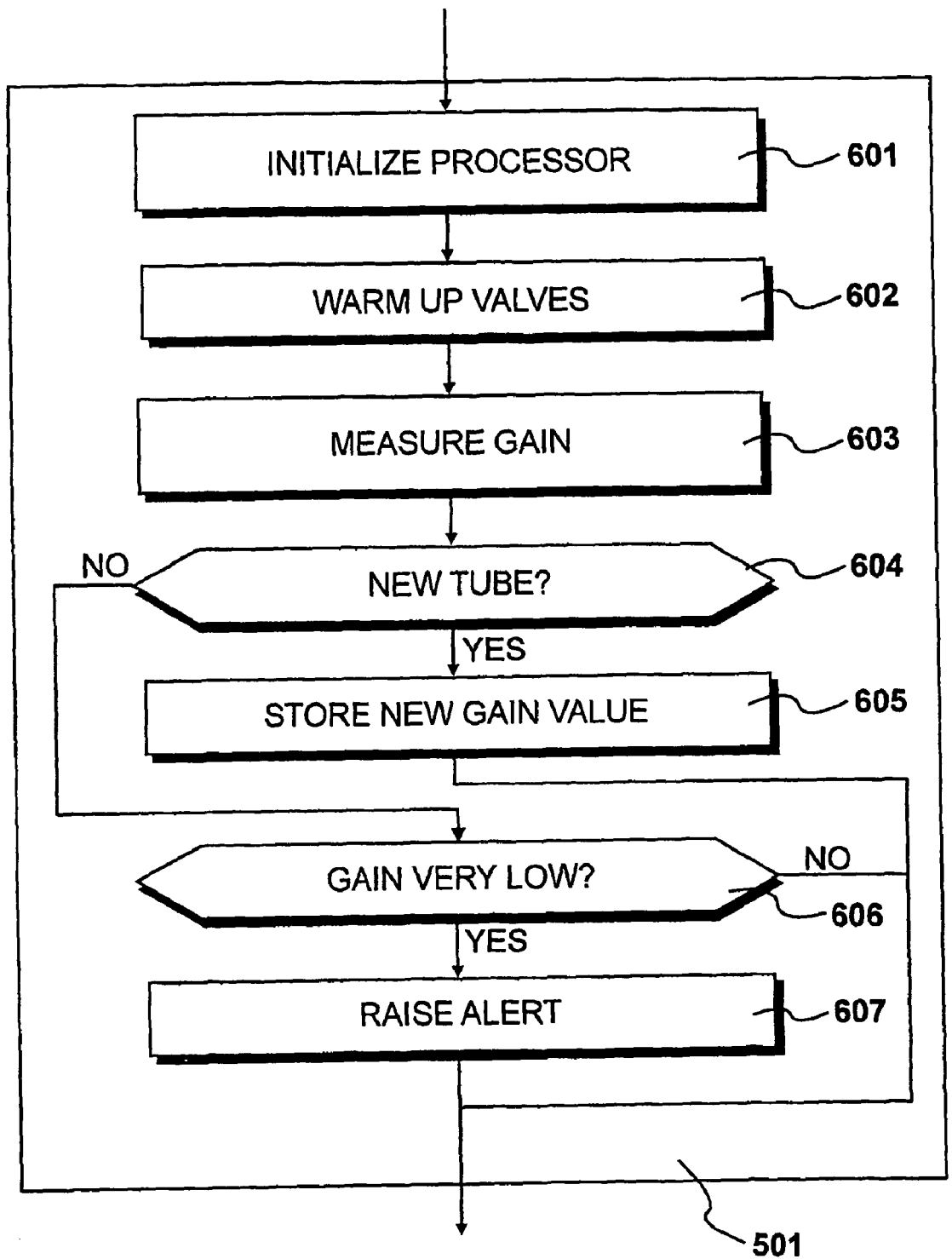
FIG. 6 details pre-operational activities identified in FIG. 5.

Pre-operational activities 501 are detailed in FIG. 6. At step 601 the processing device 201 is initialised and initial conditions are set.

Digital to analog converters 401 are initially set to zero so as to give a maximum negative grid bias to all of the tubes. Thus, initially, all of the tubes are heavily turned off. The grid bias is forced to a maximum negative voltage with respect to the cathode, with the cathode being at ground potential. In a preferred embodiment, the grid is driven to minus 50 volts, thereby making it substantially more negative than the cathode and prohibiting the conduction of any current through the tube.

At step 602 the tubes are allowed to warm-up. Registers are incremented by unity each half second followed by a statement to the effect that if greater than variable "warn-up" then set warm-up flag. After warm-up, the warm-up flag is cleared and the warm-up procedure is not performed again. In this way, the valves are allowed to warm-up, the HT supply is then applied and the grid bias voltage is ramped up from its heavily off position to an operational condition.

At step 603 gain is measured for each of the tubes within the amplifier. In a preferred embodiment, when a new tube has been inserted within the amplifier, the new value of gain (that is to say the transconductance calculated by dividing outward current by input voltage) is written to storage. Each time the amplifier is switched on, the present gain is compared against the stored value of gain to determine the value of tube degradation. If suddenly the gain provided by the tube increases dramatically from the previously stored value this indicates that a new tube has been inserted and the process is reset. Thus, by this mechanism it is not necessary to inform the control device 101 that a tube replacement has taken place.

In, the preferred embodiment shown in FIG. 6, a question is asked at step 604 as to whether a new tube is present and if answered in the affirmative, new gain values are stored at step 605. Alternatively if the question asked at step 604 is answered in the negative, a question is asked at step 606 as to whether the gain is very low. If this is question is answered in the affirmative, an alert is raised at step 607 to the effect that the tube has degraded substantially and that a replacement may be required.

In order to determine the gain of the tube, the tube is driven to two or more known anode current values which in turn removes effects due to changing high tension voltages. The degree of bias voltage required in order to achieve these currents is determined thereby allowing calculations to be made with respect to the differences. In a typical example, a fresh tube may require an output value of one thousand two hundred to give 30 mA of cathode current. However, after a period of time, due to degradation, it may require an output value of three thousand to obtain the same level of cathode current. It should therefore be appreciated that in a preferred embodiment tube degradation is determined by considering differences over a period of time given that the preferred system does not have a mechanism for the direct measurement of grid voltages.

FIG. 7

Figure 7:
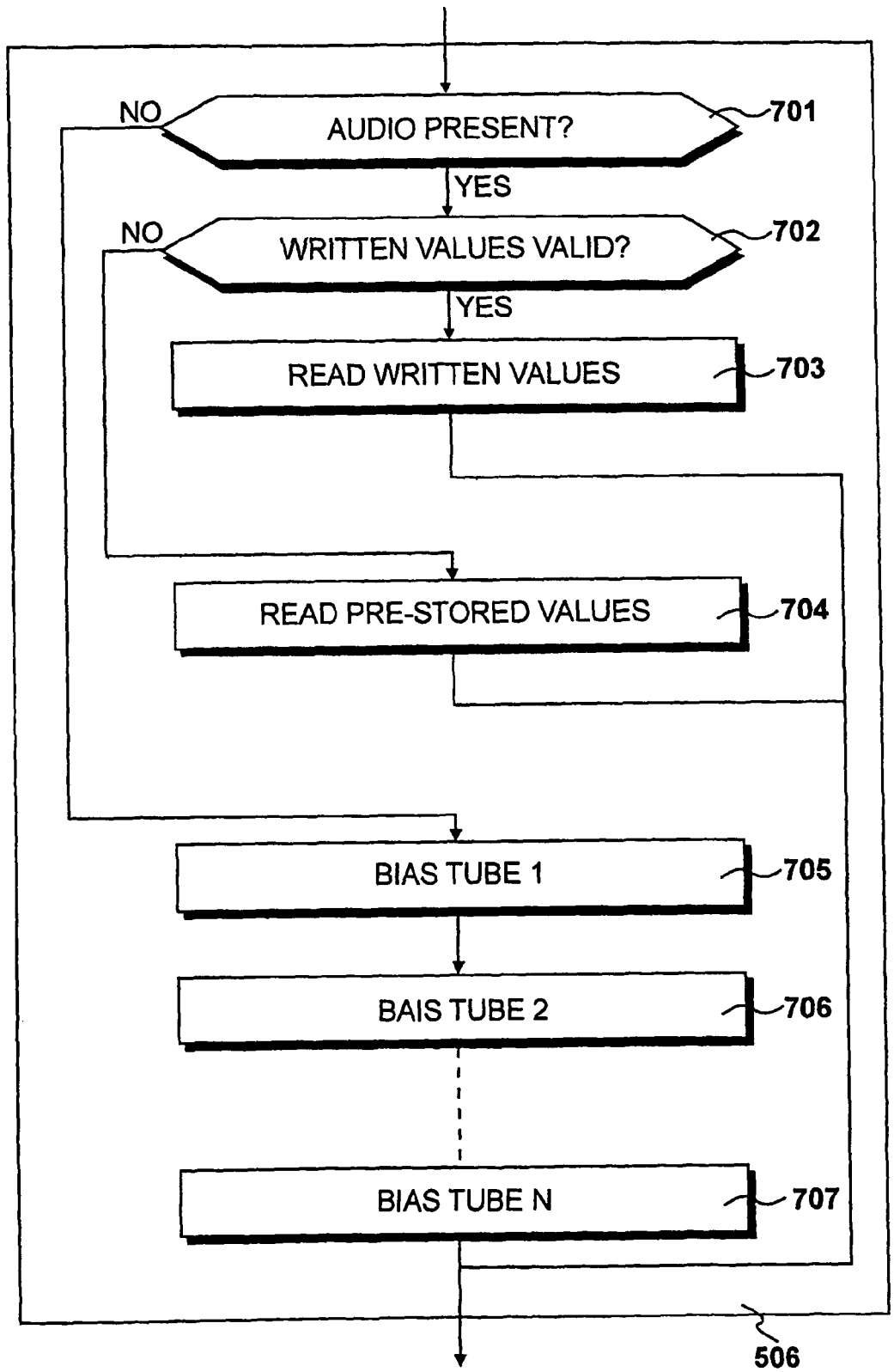
FIG. 7 details operational activities identified in FIG. 5.

Operational activities 506 are detailed in FIG. 7. At step 701 a question is asked as to whether an audio signal is present. If an audio signal is present, it is not possible to perform control procedures, however it is necessary to apply an appropriate grid bias in order to effect appropriate amplification of the incoming audio signal. Under these circumstances, it is necessary to rely on pre-stored values so that these pre-stored values may be deployed until an opportunity is identified for performing measurements when no audio signal is present.

If the question asked at step 701 is answered in the affirmative, to the effect that audio is present, a question is asked at 702 as to whether previously written values for bias voltage control are considered to be valid.

In the preferred embodiment, when no input audio has been detected for a substantial period of time, such as, for example, two minutes, the control device 101 enters an alternative mode of operation, the full details of which will be depend upon options chosen during the commissioning stages. Part of these alternative procedures include writing the present control values for the output grid, that is the output values produced by the processing device 201, to non-volatile storage. Furthermore, given that it is possible for the processor to be interrupted during this process, a flag or similar is modified at the start of the write process and then returned to its original condition at this end of the process. Thus, if interrupted, the reestablishment of the value will be incorrect and any subsequent reading operation will identify the stored values as being invalid.

Thus, at step 702 a question is asked as to whether the values written to non-volatile storage are considered to be valid and when answered in the negative alternative pre-stored values are read at steps 704. These pre-stored values are hard-coded within the processing device 201 and represent values of grid voltage that may be considered safe under all operating conditions. Thus, in most situations, the safe values of grid voltage will not result in optimum operation but optimum operation will be restored after the biasing procedures have been implemented by the processing device 201.

If the written values are considered to be valid, resulting in the question asked at 702 being answered in the affirmative, the written values are read at 703. This will produce a better result than reading the pre-stored values at steps 704 but again the values will be updated when it is possible for the control device to perform the biasing operations.

In addition to storing values for grid bias voltage, the alternative procedures performed after detecting the absence of audio for a long period of time, may also include modifying the operation of the amplifier itself such as by forcing the amplifier into a standby condition for example. Thus, under these conditions, it is not necessary for an operative to manually select the standby condition given that the standby condition will be effected automatically due to the long absence of an audio signal. Subsequently, upon detection of an audio signal an interrupt will result in HT power being returned to the amplifier, again avoiding the necessity for the user to re-establish normal power levels.

For guitar amplifiers, more sophisticated operations may be effected during the alternative procedures. In some situations, it is known for the perceived quality of the amplifier to improve after being worked due to the input of an audio signal. Although such process may result in the tubes being described has "hot", experiments have shown that this preferred mode of operation may actually result in the temperature of the valves decreasing. Consequently, during the standby mode, it may be preferable to adjust grid bias voltage so as to reduce the operational temperatures of the tubes and thereby maintain their condition in this preferred "hot" state.

Before entering the alternative procedures and as illustrated in FIG. 7, in response to the question asked at step 701 being answered in the negative, to the effect that audio is not present, biasing procedures are performed upon tube 1 at step 705. Similar procedures are performed on tube 2 at step 706 and so on until biasing procedures are performed upon tube N at step 707. In a preferred embodiment, N is equal to 4 therefore the biasing procedures will be repeated four times within each control device 101. Furthermore, in the preferred embodiment, each biasing procedure is completely independent thereby allowing multiple control devices to be included within a single amplification system.

FIG. 8

Figure 8:
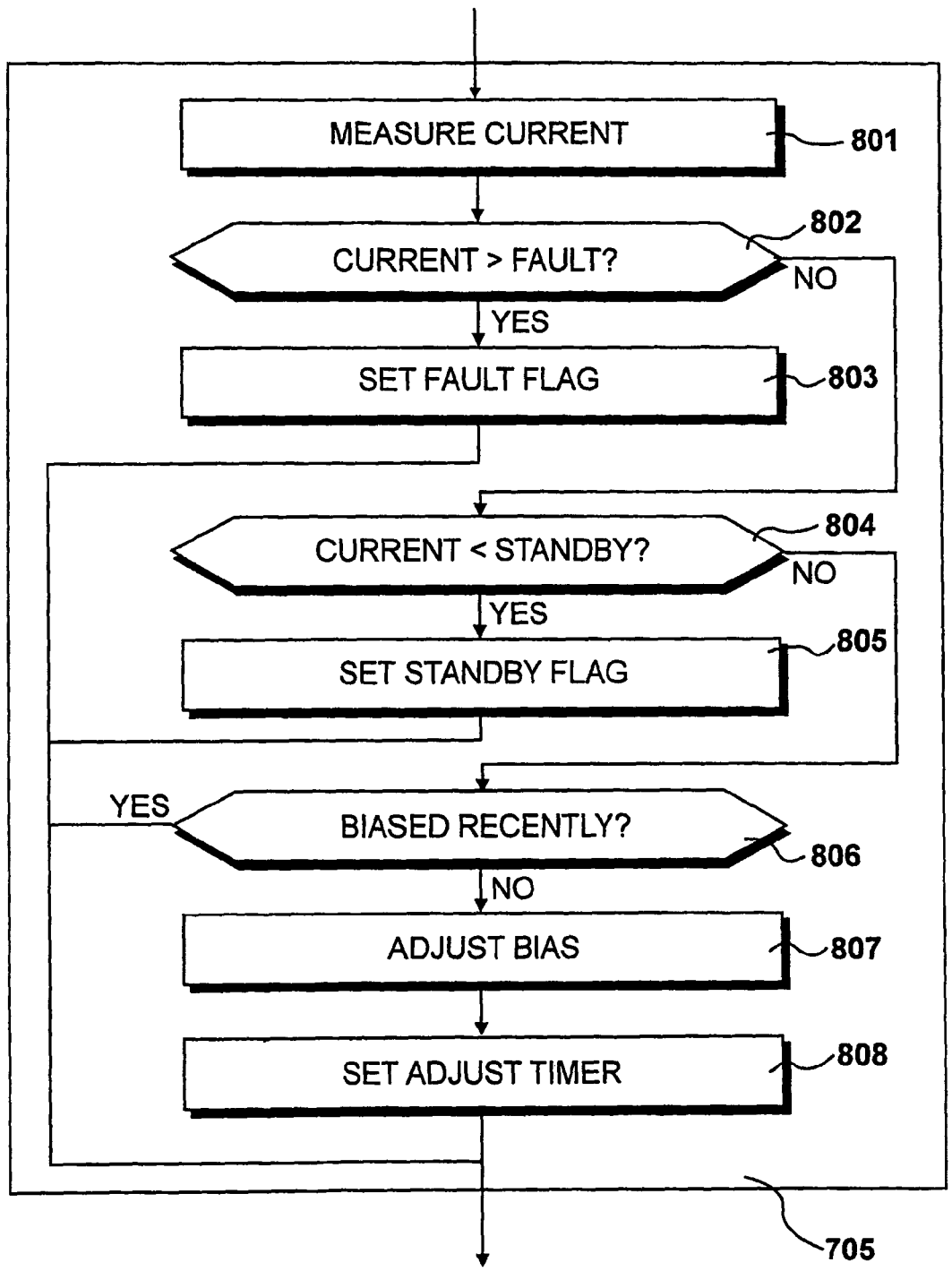
FIG. 8 details procedures for biasing a tube, identified in FIG. 7.

Procedures 705 for the biasing of tube 1 are detailed in FIG. 8. It should also be appreciated that the procedures detailed in FIG. 8 are substantially similar for process 706 and process 707.

At step 801 cathode current is measured by measuring the voltage drop across resistor 106 as previously described. The measurement of current is preferably repeated many times, as detailed in FIG. 9.

At step 802 a question is asked as to whether the measured current is larger than a value stored representing a fault. If answered in the affirmative, a fault condition is identified and the fault flag is set at step 803. In a preferred embodiment, the procedures shown in FIG. 8 are performed in response to an interrupt and the flag set at step 803 is then acted upon when returning to a main routine as illustration in of FIG. 5. In response to the fault flag being set at step 803, no further action is performed and a response is made to the fault at step 503.

If the question asked at step 802 is answered in the negative, a question is asked at step 804 as to whether the measured current is smaller than the pre-stored value representing a standby condition. Thus, if the measured current value is very small it is assumed that the amplifier has been placed in a standby condition and the standby flag is set at step 805. Again, further procedures may be implemented elsewhere, such as entering an alternative mode of operation as previously described.

If the question asked at step 804 is answered in the negative, to the effect that the amplifier has not been placed in a standby mode, a question is asked at step 806 as to whether biasing operations have been performed recently. This assessment is made in response to the value of a timer, set at step 808. Thus, the procedures shown in FIG. 7 will be performed many times, given the processing capabilities of the processing device 201. However, it is not necessary to continue making adjustments to the bias voltage therefore for many iterations the biasing procedures will be bypassed until an appropriate value, determined by the timer, as been reached. Current continues to be measured however in order to identify fault conditions in particular and in this embodiment to identify standby conditions.

If the question asked at step 806 is answered in the negative, to the effect that a biasing process has not been performed recently, bias adjustments are made at step 807 whereafter at step 808 the timer is reset such that biasing adjustments are not made on the next interrupt call.

FIG. 9

Figure 9:
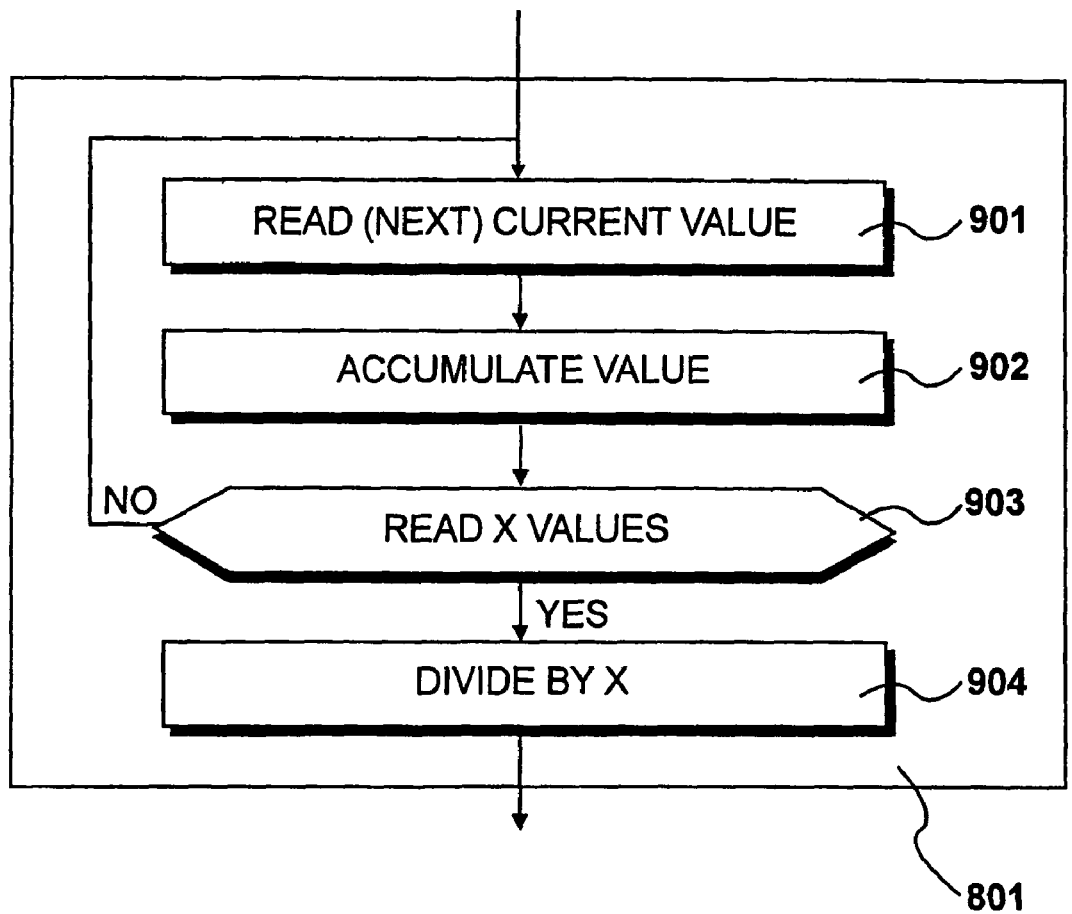
FIG. 9 details procedures for measuring cathode current, identified in FIG. 8.

Procedures 801 for measuring cathode current are detailed FIG. 9. At step 901 the next current value is read by measuring the voltage across resistor 106, as previously described. The value read at step 901 is supplied to an accumulator at step 902 and a question is asked as step 903 as to whether x values have read. In a preferred embodiment, x is set to 128 therefore 128 values are read before the question asked at step 903 is answered in the affirmative.

After reading 128 values, the accumulated value is divided by x (i.e. by 128 in a preferred embodiment) to give an average value for the cathode current that may be considered very accurate and stable through the averaging process.

Thus, in the preferred embodiment, the measuring step measures the output current many times to produce a plurality of output measurements and then averages said plurality of output measurements to produce an actual output current value.

FIG. 10

In a preferred embodiment, measuring, comparing and adjusting are performed repeatedly until the actual current value is considered to be close enough to the preferred current value. In particular, in the preferred embodiment, the adjusting step adjusts the grid bias voltage by an amount that is related to the size of the difference between the actual output current value and the preferred output current value.

Figure 10:
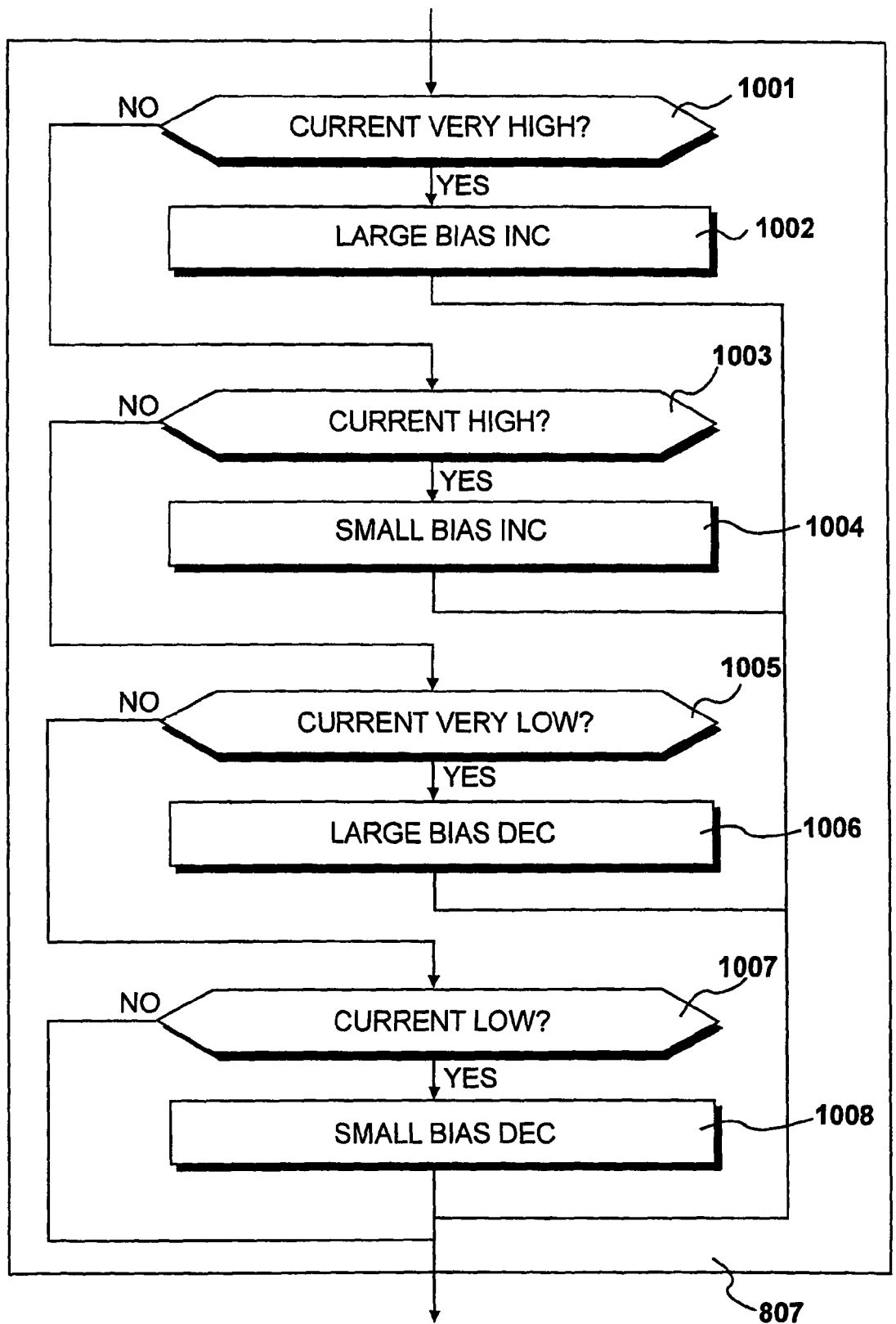
FIG. 10 details procedures for adjusting grid bias, identified in FIG. 8.

Procedures 807 for adjusting grid bias are detailed in FIG. 10. At step 1001 a question is asked as to whether the current is considered to be very high and if answered in the affirmative, a large bias increment is made at step 1002. Thus, if the cathode current is high, the bias current is incremented negatively in order to reduce cathode current.

If the question asked at step 1001 is answered in the negative, to the effect that the current is not very high a question is asked at step 1003 as to whether the current is considered to be high. On this occasion, when answered in the affirmative, a small bias increment is made at step 1004. Thus again, the bias level is increased negatively but on this occasion by a smaller amount.

Similar procedures are performed if the current is considered to be low. In response to questions asked at step 1001 and 1003 being answered in the negative, a question is asked at step 1005 as to whether the current is considered to be very low. On this occasion, when answered in the affirmative, a large bias decrement is made at step 1006. Thus, the negative grid voltage is reduced by a substantial amount. However, if the question asked at step 1005 is answered in the negative a question is asked at step 1007 as to whether the current is considered to be low. Thus, when answered in the affirmative at step 1007, the current is low but not very low. Thus, a small bias decrement is made at step 1008.

In this preferred embodiment, a distinction is made between a very large difference and a modest difference although in alternative embodiments further divisions may be included. In addition, the actual amounts that are considered to be very high or very low are subject to implementation. In a preferred embodiment, the current value is considered to be very high if its converted value produces a figure that is greater than the reference value by 15 increments. Under such circumstances, the input for the digital to analog converter for controlling grid bias is adjusted by 9 increments so as to increase the negative grid bias by a relatively large amount.

Consequently, a high current (as distinct from a very high current) is identified if the measured difference is less than 15 steps. Under these circumstances the grid bias is incremented by a single unit. Thus, eventually, the measured current will reach what is considered to be an optimum value.

In the preferred embodiment, similar figures are adopted for very low current as distinct from a low current. Thus, if the current is considered to be low by 15 increments or more, the bias is reduced by 9 increments. Alternatively, if cathode current produces a result which is less than 15 steps away from its optimum value, further adjustments are only made by 1 increment.

FIG. 11

In a preferred embodiment, control device 101 is implemented as a module 1101 that may be attached to a circuit board 1102 of an amplifier. The module 1101 has a housing for attachment to a circuit board 1102 and includes power terminals 1103 for connection to a power supply. At least one input terminal receives a representation of actual output current between a cathode and a plate of a tube being controlled. In a preferred embodiment, as previously described, four such input terminals are provided.

At least one output (preferably four) is provided for supplying a grid bias voltage to a tube being controlled. In the example shown in FIG. 11, amplifying tubes 1104, 1105, 1106 and 1107 are provided. A detection device 210 detects the absence of an audio signal. The processing device 201 compares the representation of actual output current against a preferred output current value and adjusts the grid bias voltage so as to bring the actual output current value towards the preferred output current when no audio input signal is present.

In a preferred embodiment, the input terminal receives the representation of actual output current via a series resistor 106 and a buffering amplifier 301. Preferably, the processing device includes non-volatile storage for storing preferred cathode currents and calculated grid bias voltages.

The embodiment of FIG. 11 includes four tubes and the control device 1101 is configured to control the performance of each of these tubes independently.

In the embodiment shown in FIG. 11, the module 1101 is designed to be incorporated in the overall design for an audio amplifier. This results in the implementation of an audio signal amplifier that has one or more input terminals for receiving one or more audio frequency input signals and one or more output terminals for supplying one or more amplified output signals via one or more output transformers. In the embodiment of FIG. 11, the audio amplifier is a high fidelity stereo amplifier in which a stereo input signal is received from an audio signal source 1108. The audio input signal is amplified to produce output signals that are supplied to a left loudspeaker 1109 and to a right loudspeaker 1110.

Each of the plurality (preferably four) of the thermionic tubes has a cathode, plate and a grid in which the flow of current between the cathode and the plate is controlled by an input voltage applied to the grid and a bias voltage applied to the grid. The performance control device 1101 monitors cathode currents when there is no audio input signal present and adjusts the grid bias voltages so as to adjust the cathode current flowing through each of the thermionic tubes.

In the embodiment shown in FIG. 11, four thermionic tubes are present. A first tube 1104 and a second tube 1105 amplify a first channel of a stereo pair. A third tube 1106 and a fourth tube 1107 amplify a second channel of the stereo pair. The performance control device 1101 adjusts the grid bias voltages so as to minimise harmonic distortion.

FIG. 12

An alternative amplifier design is illustrated in FIG. 12, used primarily for the amplification of audio signals produced by electric instruments, such as electric guitars and electric bass guitars. In the amplifier of FIG. 12, four thermionic tubes 1201, 1202, 1203 and 1204 are present. The thermionic tubes are divided into a first set 1201 and 1202, and a second set 1203 and 1204 configured to operate in a push-pull (class B or class A/B) configuration.

The performance control device may be substantially similar to device 1101 and may be incorporated as part of the amplification design. However, in the embodiment of FIG. 12, the performance control device has been retro-fitted to an existing amplifier circuit and is enclosed within a black acrylic tube 1205 looking substantially similar to existing tubes within the amplifier. Within acrylic tube 1205, the electronic devices are mounted on a circuit board 1206 and an LED 1207 is provided which is configured to flash when indicating a fault condition or the requirement to replace a tube.

In this embodiment, an arrangement of pins 1208 is provided extending from the acrylic tube which has an appearance substantially similar to that of the existing tubes but in a preferred embodiment it is not compatible with the existing tubes so as to prevent inadvertent insertion into an incorrect socket.

In a preferred embodiment, wires extend from the housing that are attached to a respective interface device 1209, 1210, 1211 or 1212. Each interface device is arranged to be inserted into an existing socket attached to a circuit board 1213. Insertion of the interface device is made after the respective tube has been removed, whereafter the thermionic tube is then inserted into the interface device.

Wires extending from the control device 1205 include first wires for current measurement, second wires for supplying grid voltages and third wires for receiving power from tube heater terminals. Thus, in a preferred embodiment, it is not necessary to provide additional power supplies for the control device, given that heaters within the tubes require a standard voltage source.

As previously stated, in the preferred embodiment, the housing has an appearance that is substantially similar to a thermionic tube. Furthermore, in a preferred embodiment, the housing houses a transformer for transforming the received tube heater voltage to provide all voltages required by the control device.

In a preferred embodiment, an input device 1214, implemented as a row of switches, extends from the housing 1205 to facilitate the inputting of control data for different tube types. Thus, in this embodiment, it is possible for tubes 1201 to 1204 to be replaced by alternative tube types given that appropriate modifications may be entered via the input device 1214 so as to achieve optimised operation that may be different from the initial design.

An audio input signal is received from an electric guitar or similar audio source via an input socket 1215. Similarly, amplified output is supplied to one or more loudspeakers 1216. In a guitar amplifier of the type shown in FIG. 12, it is likely that the tubes will be driven hard in order to produce a preferred distorted tone. It is appreciated that such use reduces tube life but it would be undesirable to modify the operation of the amplifier when actually amplifying an input signal, as this may change the desired tonal characteristics and would therefore be considered unacceptable to most guitar players. In particular, if any measures are taken to modify the operation of tubes used in this way, it is likely that the amplifier will be considered similar to a solid state amplifier. Consequently, in one embodiment of the guitar amplifier, no measures are taken to adjust the use of the device when amplifying except for optimising the grid bias voltage. However it is possible to make modifications to amplifier operation when the amplifier is not actually amplifying an audio signal, so as to prolong tube life.

Although class B operation is considered desirable in terms of being more efficient and particularly so when no input signal is being received, it is also appreciated that some guitarist prefer class A operation and guitar amplifiers exist which operate in this way. In an alternative embodiment, given that the system relies upon identifying the presence or absence of an audio signal, the grid bias voltages may be adjusted so as to force the amplifier into class A operation when an input signal is being received whereafter, upon detecting the absence of an audio signal, the grid bias is rapidly negatively increased so as to force the amplifier back into the class B mode of operation.

Furthermore, grid bias levels may be adjusted when no audio signal has been identified so as to minimise tube damage, minimise heat dissipation or maintain amplification characteristics.

The invention claimed is:

1. A method of controlling the performance of a thermionic tube having a cathode, a plate and a grid that is configured to provide amplification of an audio derived signal including the application of a grid bias voltage to said grid, comprising the steps of:
   detecting the absence of an input audio signal; and, in the absence of an input audio signal:
      measuring output current between a cathode and a plate of the tube to identify an actual output current value;
      comparing said actual output current value against a preferred output current value; and
      adjusting a grid bias voltage so as to bring said actual output current value towards said preferred output current value.

2. The method of claim 1, wherein said measuring step comprises the steps of:
- measuring said output current many times to produce a plurality of output measurements; and
- averaging said plurality of output measurements to produce said actual output current value.

3. The method of claim 1, wherein said measuring step, said comparing step and said adjusting step are performed iteratively until the actual current value is considered to be close enough to said preferred current value.

4. The method of claim 3, wherein said adjusting step adjusts the grid bias voltage by an amount that is related to the size of the difference between the actual output current value and the preferred output current value.

5. The method of claim 1, wherein said detecting step further comprises the steps of:
- ascertaining whether an audio signal has been absent for more than a predetermined quiet period and, in response to ascertaining that no audio signal has been present for longer than said predetermined quiet period;
- storing a representation of the present grid bias voltage to produce a stored grid bias value;
- modifying the grid bias voltage so as to change the performance of the thermionic tube from a preferred tube performance to a modified tube performance; and, upon the detection of an audio signal:
- reading said stored grid bias value; and
- applying said stored grid bias value so as to re-engage said preferred tube performance.

6. The method of claim 1, wherein said measuring step also includes the steps of:
- considering said actual output current value against a predetermined maximum value;
- identifying a fault condition if said actual output current value is considered greater than said predetermined maximum value; and
- responding to said fault condition identified by said identifying step.

7. The method of claim 1, wherein steps for controlling performance are temporarily displaced by steps for monitoring tube integrity, said monitoring method comprising the steps of:
- assessing the gain provided by a new tube;
- storing a value representing the gain of the tube when new; and
- upon each application of power, comparing the present gain of the tube against said previously stored value.

8. An apparatus for controlling the performance of a thermionic tube when amplifying an audio signal, in which each thermionic tube has a cathode, a plate and a grid for receiving a grid bias voltage and, in use, said thermionic valves are attached to a circuit board within an audio amplifier comprising:
- a housing for attachment to a circuit board;
- power terminals for connection to a power supply;
- at least one input terminal for receiving a representation of actual output current between a cathode and a plate of a tube being controlled;
- at least one output terminal for supplying a grid bias voltage to said tube being controlled;
- a detection device for detecting the absence of an audio signal; and
- a processing device for comparing said representation of actual output current against a preferred output current value and adjusting the grid bias voltage so as to bring the actual output current towards the preferred output current when no audio input signal is present.

9. The apparatus of claim 8, wherein said input terminal receives said representation of actual output current via a series resistor and a buffering amplifier.

10. The apparatus of claim 8, wherein said processing device includes non-volatile storage for storing preferred cathode currents and calculated grid bias voltages.

11. The apparatus of claim 8, configured to control the performance of a plurality of thermionic tubes, in which said processing device is configured to compare a plurality of representations of actual output currents.

12. The apparatus of claim 8, wherein wires extend from said housing that are attached to an interface device, wherein said interface device is arranged to be inserted into an existing socket for the thermionic tube and said thermionic tube is then inserted into the interface device.

13. The apparatus of claim 12, wherein said wires include first wires for current measurement, second wires for supplying grid voltages and third wires for receiving power from tube heater terminals.

14. The apparatus of claim 13, wherein said housing has an appearance substantially similar to a thermionic tube and houses a transformer for transforming a received tube heater voltage.

15. The apparatus of claim 14, wherein an input device extends from said housing to allow the inputting of control data for different tube types.

16. An audio signal amplifier, comprising:
- one or more input terminals for receiving one or more audio frequency input signals;
- one or more output terminals for supplying one or more amplified output signals via one or more output transformers;
- a plurality of thermionic tubes, each having a cathode, a plate and a grid, in which the flow of current between said cathode and said plate is controlled by an input voltage applied to said grid and a bias voltage applied to said grid; and
- a performance control device for monitoring cathode currents when there is no audio input signal present and adjusting said grid bias voltages so as to adjust cathode current flowing through each thermionic tube.

17. The audio signal amplifier of claim 16, comprising four thermionic tubes, in which:
- a first tube and a second tube amplify a first channel of a stereo pair;
- a third tube and a fourth tube amplify a second channel of a stereo pair; and
- said performance control device adjusts said grid bias voltages so as to minimise harmonic distortion.

18. The audio signal amplifier as claimed in claim 16, wherein:
- said plurality of thermionic tubes are divided into a first set of tubes and a second set of tubes configured to operate in a push-pull configuration; and
- said performance control device adjusts said grid bias voltage to encourage a degree of harmonic distortion.

19. The audio signal amplifier of claim 18, wherein said performance control device adjusts said grid bias voltage to encourage class A type operation when an input signal is detected and class B type operation when no audio is present.

20. The audio signal amplifier of claim 18, wherein said performance control device adjusts the grid bias voltage when no audio input signal has been detected for a predetermined period of time, so as to avoid tube damage, minimise heat dissipation or maintain amplification characteristics.

* * * * *